(12) United States Patent
Franz et al.

(10) Patent No.: US 12,446,143 B2
(45) Date of Patent: Oct. 14, 2025

(54) AUXILIARY MODULE TO SUPPORT PRINTED CIRCUIT ASSEMBLY OF ELECTRONIC DEVICE

(71) Applicant: HEWLETT PACKARD ENTERPRISE DEVELOPMENT LP, Spring, TX (US)

(72) Inventors: John P. Franz, Houston, TX (US); Ernesto Juan Ferrer, Aguadilla, PR (US); Laura Lester, Spring, TX (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 336 days.

(21) Appl. No.: 18/350,190

(22) Filed: Jul. 11, 2023

(65) Prior Publication Data
US 2025/0024582 A1 Jan. 16, 2025

(51) Int. Cl.
H05K 1/02 (2006.01)
H05K 1/14 (2006.01)
H05K 7/20 (2006.01)

(52) U.S. Cl.
CPC .......... *H05K 1/0203* (2013.01); *H05K 1/144* (2013.01); *H05K 7/2049* (2013.01)

(58) Field of Classification Search
CPC .... G06F 1/185; G06F 2200/201; G06F 1/203; H05K 1/0203; H05K 1/144; H05K 7/2049; H05K 7/20272; H05K 7/20772; H05K 7/20418; H05K 7/20781; H05K 7/20436; H05K 7/20254
See application file for complete search history.

(56) References Cited

U.S. PATENT DOCUMENTS

| 6,181,553 B1* | 1/2001 | Cipolla | G06F 1/203 361/689 |
| 6,545,870 B1* | 4/2003 | Franke | H01L 23/40 257/E23.083 |
| 6,724,629 B1* | 4/2004 | Augustin | H01L 23/4093 174/16.3 |

(Continued)

OTHER PUBLICATIONS

Extended European search report, EP App. No. 24186889.2, Dec. 11, 2024, 10 pages.

*Primary Examiner* — Adam B Dravininkas
(74) *Attorney, Agent, or Firm* — Hewlett Packard Enterprise Patent Department

(57) ABSTRACT

Auxiliary module includes attachment elements, cooling component, and auxiliary PCA having a circuit board, an electrical connector, and electronic components. The attachment elements are configured to attach the auxiliary module to supporting arms protruding from the PCA such that the electrical connector is coupled to a complementary electrical connector of the PCA, and the attachment elements extend through apertures in the supporting arms. The cooling component is attached to the auxiliary PCA and includes a first portion thermally coupled to cooling conduit in an installed state of the auxiliary module and a second portion thermally coupled to the electronic components in an attached state of the cooling component to the auxiliary PCA. In an attached state of the auxiliary module to the supporting arms and a coupled state of the electrical connector with the complementary electrical connector, the auxiliary module is movable along multiple directions relative to the supporting arms.

20 Claims, 10 Drawing Sheets

(56) References Cited

U.S. PATENT DOCUMENTS

| | | |
|---|---|---|
| 7,019,973 B2 | 3/2006 | Rivera |
| 7,042,734 B2 | 5/2006 | Hensley et al. |
| 7,690,928 B2 | 4/2010 | Lappoehn |
| 8,636,543 B2 | 1/2014 | McNamara |
| 9,591,781 B2 | 3/2017 | Vanderveen et al. |
| 11,316,290 B2 | 4/2022 | Kliever |
| 2003/0156400 A1 | 8/2003 | Dibene et al. |
| 2003/0161108 A1* | 8/2003 | Bright .................. G02B 6/4277 |
| | | 361/707 |
| 2004/0118584 A1* | 6/2004 | Franz .................. H01L 23/4093 |
| | | 174/535 |
| 2018/0276171 A1 | 9/2018 | Norton et al. |
| 2020/0101570 A1* | 4/2020 | Potter .................... G06F 1/203 |
| 2023/0345668 A1* | 10/2023 | Lunsman ........... H05K 7/20809 |

\* cited by examiner

AUXILIARY MODULE TO SUPPORT PRINTED CIRCUIT ASSEMBLY OF ELECTRONIC DEVICE

BACKGROUND

An electronic device, such as a computing device, a network device, or the like may include one or more printed circuit assemblies (PCAs) which include electronic components. The electronic components may include primary electronic components such as processing resources (e.g., a central processing unit (CPU), graphical processing unit (GPU), System-on-Chip (Soc), Application Specific Integrated Circuit (ASIC), etc.), and secondary or auxiliary electronic components (e.g., voltage regulators, network interfaces, etc.) that support the operations of the primary electronic components and/or provide supplemental or auxiliary functions for the electronic device. In many electronic devices, one or more primary electronic components and one or more auxiliary electronic components may be part of the same PCA and are mounted to the same circuit board of the PCA. This is often the case, for example, with auxiliary electronic components such as voltage regulators or other power conversion components that supply electronic power to the processing resources. For example, typically electronic devices may include a primary PCA (e.g., a motherboard or a main PCA) having a circuit board, one or more processors (primary electronic components), and one or more voltage regulators (auxiliary electronic components) for supplying the electronic power to the processors, where the processors and the voltage regulators are disposed on the circuit board.

During operation of the electronic device, each of the auxiliary electronic components may generate heat. If such heat is not dissipated, temperatures of the auxiliary electronic components may exceed their thermal specifications, thus resulting in degraded performance, reliability, and life expectancy of the individual electronic components and/or the electronic device, as a whole. To minimize such adverse effects of the heat, the electronic device may include a thermal management device to remove heat. In some electronic devices, liquid cooling is used, in which case the thermal management device may include a cooling device (e.g., a cold plate) that is disposed in thermal contact with the electronic components to remove the heat away from such electronic components.

BRIEF DESCRIPTION OF THE DRAWINGS

Various examples will be described below with reference to the following figures.

DETAILED DESCRIPTION

Figure 1A:
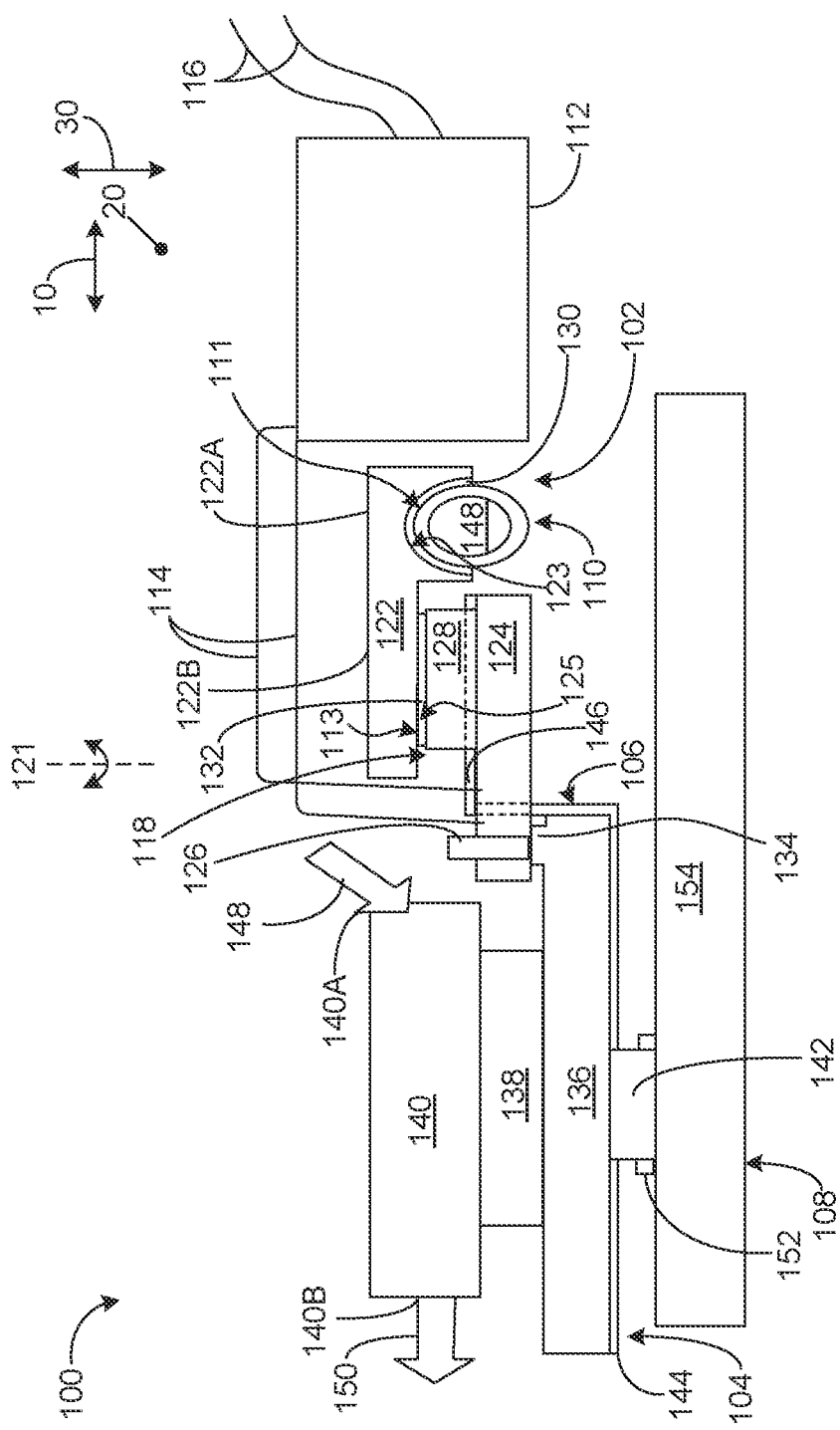
FIG. 1A illustrates a block diagram of an electronic device having an auxiliary module, a printed circuit assembly (PCA), a main PCA, a support structure, and a cooling conduit according to an example of the present disclosure.

The following detailed description refers to the accompanying drawings. For purposes of explanation, certain examples are described with reference to the components illustrated in FIGS. 1-11. The functionality of the illustrated components may overlap, however, and may be present in a fewer or greater number of elements and components. Moreover, the disclosed examples may be implemented in various environments and are not limited to the illustrated examples. Wherever possible, the same reference numbers are used in the drawings and the following description to refer to the same or similar parts. It is to be expressly understood, however, that the drawings are for the purpose of illustration and description only. While several examples are described in this document, modifications, adaptations, and other implementations are possible. Accordingly, the following detailed description does not limit the disclosed examples. Instead, the proper scope of the disclosed examples may be defined by the appended claims.

As noted above, in many electronic devices, one or more of primary electronic components (e.g., the processing resources) and one or more auxiliary electronic components (e.g., voltage regulators) are imbedded directly into the same circuit board of a primary PCA (e.g., a motherboard or a main PCA) of the electronic device. One potential drawback of this implementation is that, if one of the electronic components of the primary PCA fails, it may be difficult to repair or replace the failed electronic component without risking collateral damage to the primary PCA. Because of the risk of collateral damage, specialized tools and procedures may be needed and much care may need to be taken during the repair/replacement, and this may increase the costs of the repair/replacement. Moreover, even when care is taken, such collateral damage may still sometimes occur, which may result in the entire primary PCA needing to be replaced (which can be very expensive). Thus, repairs or replacements of the failed electronic components may be very difficult and expensive, even if the electronic components being repaired/replaced is itself relatively inexpensive. Such costly repairs and/or primary PCA replacements often occur mainly due to the failure of the auxiliary electronic components, such as a voltage regulator, as these auxiliary electronic components may be prone to failing sooner than other electronic components of the primary PCA.

Another potential drawback of the above-described implementation with the primary electronic component (e.g., processing resources) and the auxiliary electronic components (e.g., voltage regulators) being co-located on the same circuit board is that, in some cases, the signal wiring for communicating signals to and from the processing resources and the power wiring for providing power from the voltage regulators to the processing resources may compete for the same limited space within the available layers of the circuit board, and sometimes there may be insufficient space for both. This difficulty is becoming more common as electronic components become more complicated and consume more power. Moreover, providing more layers in the circuit board to accommodate all the signaling and power needs may not always be feasible, as it may increase the circuit board thickness, increase cost, and/or reduce signal integrity.

Accordingly, one way to address the above-described issues is to provide some of the auxiliary electronic components as part of a separate, replaceable, PCA instead of imbedding them in the primary PCA having the primary electronic components. In particular, a replaceable power conversion module having a separate circuit board and auxiliary electronic components (e.g., power conversion components) imbedded in such circuit board may be used instead of imbedding the power conversion components directly into the primary PCA. Because the auxiliary electronic components such as the power conversion components are provided as part of a separate replaceable power conversion module, if those components fail they may be relatively easily replaced by replacing the replaceable power conversion module as a unit without the risk of damaging other parts of the primary PCA and without requiring replacement of the entire primary PCA, thus mitigating the difficulties noted above related to the replacement and service costs and serviceability problems of the traditional implementation.

However, designing and manufacturing electronic devices in which the auxiliary electronic components, such as power conversion components which are provided as part of a separate replaceable power conversion module (or an auxiliary module), may sometimes be a challenge because of space constraints and diverse geometry of the auxiliary module. Specifically, in previous approaches in which some auxiliary electronic components, such as power conversion components (e.g., voltage regulators) were provided adjacent to processing resources on the same circuit board, the auxiliary electronic components could be cooled by the same cooling component (e.g., cold plate) as the processing resource (e.g., by extending the cold plate slightly beyond the processing resource to also cover the voltage regulator), but if the auxiliary electronic component is provided as part of a separate auxiliary module, it may not be feasible to use the same cooling component to cool the auxiliary electronic components and the primary electronic components. But providing a separate cooling component to cool the auxiliary module (e.g., replaceable power conversion module) may also be difficult because, in view of the auxiliary module being separate from the primary PCA, it may not be feasible to control the location and orientation of the auxiliary module relative to other parts of the electronic device with the degree of precision needed for good cooling performance. In particular, the manufacturing tolerances of the cooling component, the auxiliary module, the connections between the auxiliary module and the other PCAs, and cooling loop structures, which are used for providing cooling to the auxiliary module, may all combine (stack up) in such a way that the cooling component and the cooling loop structures may sometimes be slightly out of alignment with one another, resulting in no contact or intermittent contact therebetween and thus poor thermal performance. One way to mitigate this issue would be to tighten tolerances sufficiently to ensure adequate contact between the cooling component and the cooling loop structures, but doing this may greatly increase manufacturing costs and thus may not be feasible in some circumstances. Hence, a challenge in using the separate auxiliary module (e.g., replaceable power conversion module) would be to provide the cooling component for cooling the auxiliary module economically and efficiently considering its location, geometries, and variations in the cooling loop structures tolerance.

A technical solution to the aforementioned problems includes providing an auxiliary module (e.g., an auxiliary power conversion module) including a cooling component and an auxiliary PCA, which is separate from another PCA (e.g., a processor PCA) which carries the processing resources, where the auxiliary module is configured to be electrically connected and mechanically attached to the processor PCA in such a manner that the auxiliary module can move relative to the processor PCA. Specifically, in some examples, the cooling component and the auxiliary PCA are configured to be coupled together and attached to supporting arms that protrude laterally from the processor PCA, while an electrical connector of the auxiliary PCA is configured to electrically connect with a complementary electrical connector of the processor PCA, wherein these mechanical and electrical connections are such that they allow the auxiliary PCA and the cooling component to move together as a unit along multiple directions. This ability to move the auxiliary module (i.e., the auxiliary PCA and the cooling component) while it is electrically and mechanically connected to the processor PCA may allow the location and orientation of the cooling component to be adjusted as needed to align with and mount to a cooling conduit (or a cooling loop structure) of an electronic device with good thermal contact therebetween, thereby overcoming issues related to tolerance stack up of the traditional implementation. In some examples, the cooling component may include engagement features for interfacing with the cooling conduit which may allow self-alignment of the cooling component with the cooling conduit. For example, the engagement features of the cooling component may have a half circle channel and a thin gap pad that matches the outer diameter of the cooling conduit to allow self-alignment of the cooling component with the cooling conduit.

In some examples, the auxiliary PCA and the processor PCA may be electrically connected via electrical connectors that provide a so-called floating connection which allows some relative movement between the electrical connectors while the electrical connection therebetween remains intact, such as the electrical connectors including power pins and the complementary electrical connectors including sockets/sleeves with floating capability that receive the power pins. In some examples, the electrical connectors allow for up to +/−1 mm of radial movement of the power pins relative to the sockets. This relative movement between the electrical connectors (e.g., the power pins and sockets) may allow for relative movement between the auxiliary PCA and the processor PCA while maintaining the electrical connection therebetween. Further, in some examples the cooling component is fixedly coupled to the auxiliary PCA, and both are mechanically attached to the processor PCA by attachment to the supporting arms extending from the processor PCA. In some examples, this mechanical attachment includes a plurality of fasteners that extend through apertures (slots) in the supporting arms, and which may move within the apertures in one or more directions (e.g., due to the apertures being oversized), thus allowing for some movement of the auxiliary module while still mechanically attaching the auxiliary module to the processor PCA. Thus, both the electrical connections and the mechanical attachments allow the auxiliary module to move relative to the processor PCA, which can allow the cooling component to be moved into an aligned position with the cooling conduit even if they are initially misaligned. In contrast, if the auxiliary PCA and cooling component were rigidly fixed to the processor PCA, this may create fit issues because of tolerancing limitations of the cooling conduit location (i.e., the cooling component may not be aligned with the cooling conduit).

In one or more examples, the cooling component may be fixedly coupled to the auxiliary PCA, and the auxiliary module (i.e., cooling component and the auxiliary PCA) may be attached to the processor PCA by the plurality of fasteners that extends through a plurality of openings of the cooling component and a plurality of attachment elements (e.g., a plurality of standoffs) disposed on a circuit board of the auxiliary PCA and protruded through a corresponding slot (or aperture) formed on the supporting arm of the processor PCA. In some examples, a first opening of the plurality of openings may be a controlling position feature, which allows the auxiliary module to be aligned in an XY direction on the cooling conduit. Similarly, a second opening (e.g., an elongated slot) of the plurality of openings may be a mounting feature, which allows rotation of the auxiliary module with tight tolerance. Further, a pair of third openings of the plurality of openings may provide thermal pad compression in the Z direction.

During assembly of the auxiliary module to the processor PCA, the cooling component of the auxiliary module may be first positioned on the cooling conduit and a biasing element of the cooling component may be partially tightened over the cooling conduit of the electronic device to partially install the cooling component on the cooling conduit. Further, the auxiliary PCA of the auxiliary module may be mounted to the supporting arm of the processor PCA such that each standoff (e.g., threaded standoff) of the auxiliary module, disposed on the circuit board of the auxiliary PCA protrudes through the corresponding aperture of the supporting arms, and the power pin of the circuit board protrudes through the socket of the processor PCA. Later, a first fastener (e.g., threaded screw) among the plurality of fasteners may be extended through the first opening (slot) of the cooling component and the corresponding standoff and tightened to fix the cooling component onto the auxiliary PCA and provide the accurate XY tolerance control to link the two parts together. This positioning feature starts aligning the floating auxiliary PCA into place. Further, a second fastener (e.g., threaded screw) among the plurality of fasteners may be extended through the second opening (elongated slot) of the cooling component and the corresponding standoff and tightened to restrain rotation of the auxiliary module about the Z direction and thereby completing the alignment of the auxiliary module. Later, a third pair of fasteners (e.g., a pair of threaded screws) among the plurality of fasteners may be extended through the pair of third openings and the corresponding standoffs and served to form a robust connection between the cooling component and the auxiliary PCA. Finally, the biasing element may be further tightened to push the half circle channel of the cooling component onto the cooling conduit to fully install the cooling component on the cooling conduit.

In some examples, the processor PCA may include a secondary electrical connector which may be electrically connected to a tertiary electrical connector of a primary PCA e.g., a motherboard or a main PCA of the electronic device. In some examples, the cooling component may be a passive heat sink. As used herein, a "passive heat sink" is a heat sink which does not contain or directly contact the liquid coolant (e.g., it does not have any coolant channels through which liquid coolant flows), but instead is thermally coupled with a separate device which carries the liquid coolant (e.g., a liquid coolant conduit, a cold plate, etc.). Thus, the passive heat sink may act as a thermal bridge between the component to be cooled and the coolant-carrying thermal component. For example, a passive heat sink may include a thermally conductive body which has one portion configured to be thermally coupled (e.g., placed in contact) with the component to be cooled and another portion configured to be thermally coupled (e.g., placed in contact) with the separate coolant-carrying thermal component (e.g., coolant conduit). For example, the passive heat sink may include a piece of conductive material (e.g., copper, aluminum, thermally conductive plastic, etc.) shaped to interface with the component to be cooled and the coolant carrying thermal component.

Compared to existing method of imbedding the power conversion components, the usage of an auxiliary module of the present disclosure may provide the benefits such as a) cooling component being the passive heat sink does not add a leak risk but provides high thermal performance results with cooling conduit contact, b) auxiliary module with poor reliability (relatively) parts can be swapped and not discard the extremely expensive processor PCA or the main PCA, c) replaceable auxiliary module will reduce service time/cost and prevent accidental damage of other internal components of the electronic device, d) self-align capability of the cooling component on the cooling conduit may allow for the thin gap pads to be disposed therebetween the cooling component and the cooling conduit which saves money and results in the best thermal performance, and e) not integrating the power on the processor PCA or the main PCA may prevent issues with critical signal routing and integrity performance . . . .

Figure 1B:
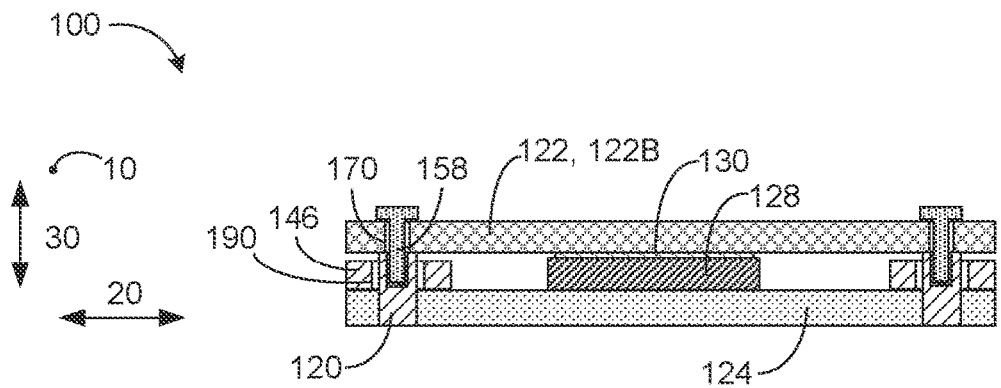
FIG. 1B illustrates a block diagram of a portion of the electronic device having the auxiliary module attached to the PCA according to an example of the present disclosure.

Referring to the Figures, FIG. 1A depicts a block diagram of an electronic device 100. FIG. 1B depicts a block diagram of a portion of the electronic device 100 having an auxiliary module 102 attached to a printed circuit assembly (PCA) 104. In the description hereinafter, FIGS. 1A-1B are described concurrently for ease of illustration. It should be understood that FIGS. 1A and 1B are not intended to illustrate specific shapes, dimensions, or other structural details accurately or to scale, and that implementations of the electronic device 100 may have different numbers and arrangements of the illustrated components and may also include other parts that are not illustrated. In some examples, the electronic device 100 may be a computer (e.g., a server, a storage device), a networking device (e.g., a switch), or the like. In the example of FIG. 1A, the electronic device 100 is a server. In some examples, the electronic device 100 includes an auxiliary module 102, a PCA 104, a main PCA 108, a support structure 106, and a cooling conduit 110.

The auxiliary module 102 includes a circuit board 124, one or more electronic components 128 mounted on the circuit board 124, and electrical connectors 126 mounted on the circuit board 124. The one or more electronic components 128 are configured to provide auxiliary or support functionality for the primary components of the PCA 104, and the electrical connectors 126 are configured to electrical couple the electronic components 128 to the PCA 104 to facilitate the provisioning of the auxiliary/support functionality. In one example described in greater detail below, the electronic components 128 include power conversion components (e.g., voltage regulators) and the electrical connectors 126 are configured to supply electrical power from the electronic components 128 to the PCA 104, and thus in this example the auxiliary module 102 may be referred to as a power conversion module. However, in other examples, the electronic components 128 could be networking/communication components, hardware accelerators, or any other auxiliary components, and the electrical connectors 126 may be configured to convey data signals instead of (or in addition to) electrical power. The description below will focus for ease of understanding primarily on the example in which the auxiliary module 102 is a power conversion module, but the principles described below would apply mutatis mutandis to the other examples mentioned above in which other types of auxiliary modules 102 are used.

The electronic device 100 may be electrically connected to a main power conversion module 112 via a first set of wires 114. In particular, the auxiliary module 102 of the electronic device 100 may be electrically connected to the main power conversion module 112 which in turn may be connected to a power source (not shown) of a rack (not shown) via a second set of wires 116. In certain examples, the main power conversion module 112 may include one or more electronic elements (not shown), which may step-down a high-voltage direct current (e.g., about 380V) to a relatively low voltage direct current (e.g., about 48V) and supply such low voltage direct current to the auxiliary module 102.

The auxiliary module 102 e.g., an auxiliary power conversion module is connected to the main power conversion module 112 via the first set of wires 114 and to the PCA 104 via electrical connectors 126, 134. In one or more examples, the auxiliary module 102 is configured to provide support e.g., electrical support to the PCA 104. In particular, the auxiliary module 102 may further step-down the relatively low voltage direct current received from the main power conversion module 112 to a low voltage direct current (e.g., about 12V to about 3.3V) and supply the low voltage direct current (electronic power) to the PCA 104 via the electrical connectors 126, 134. In one or more examples, the auxiliary module 102 includes an auxiliary PCA 118, a plurality of attachment elements 120 (see FIG. 1B), a plurality of fasteners 158, and a cooling component 122. It may be noted herein that the plurality of attachment elements 120 are not shown in FIG. 1A for ease of illustration only, but they are shown in FIG. 1B. The auxiliary PCA 118 includes a circuit board 124, an electrical connector 126, and one or more electronic components 128. In some examples, the electrical connector 126 and the one or more electronic components 128 may be mounted on and coupled to the circuit board 124. The circuit board 124 may mechanically support the electrical connector 126 and the one or more electronic components 128, and electrically connect the one or more electronic components 128 to the electrical connector 126 using conductive pathways, or signal traces or the like (not shown) disposed in the circuit board 124. The one or more electronic components 128 e.g., voltage regulators, may be used to step-down the relatively low voltage direct current to the low voltage direct current. In some examples, the electrical connector 126 may be power pins which may be configured to transmit the electronic power from the auxiliary PCA 118 to the PCA 104. The plurality of attachment elements 120 may be mounted on and coupled to one of the circuit board 124 or the cooling component 122 of the auxiliary PCA 118 to enable a plurality of fasteners 158 (see FIG. 1B) to couple the auxiliary module 102 to the PCA 104. In FIG. 1B, the attachment elements 120 are shown as coupled to the circuit board 124, but the attachment elements 120 could instead be coupled to the cooling component 122. The attachment elements 120 may be coupled to the circuit board 124 or the cooling component 122 via holes formed therein, threading, nuts, welding, brazing, adhesive, friction fitting, and/or any other fastening method. In some examples, the fasteners 158 include threaded screws/bolts and the attachment elements 120 include standoffs (e.g., threaded hollow standoffs) to receive the fasteners 158, or threaded nuts to receive the fasteners 158. In some cases, non-threaded members such as hollow standoffs, washers, etc., may also be used as part of the attachment elements 120 in addition the threaded members. In some examples, the attachment elements 120 may additionally enable the auxiliary PCA 118 to be coupled to the cooling component 122. It may be noted that the process of attaching the auxiliary module 102 to the PCA 104 and/or coupling the cooling component 122 to the auxiliary PCA 118 are discussed in greater details below.

Figure 8:
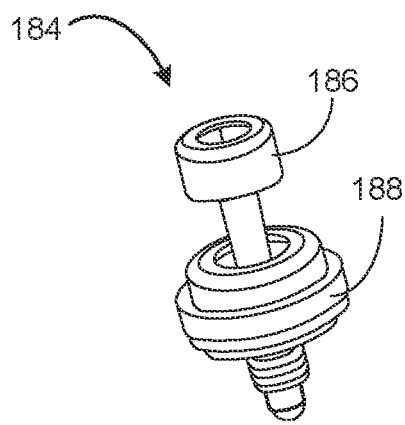
FIG. 8 illustrates a perspective view of a biasing element of the auxiliary module of FIGS. 1A-1B according to an example of the present disclosure.
Figure 10A:
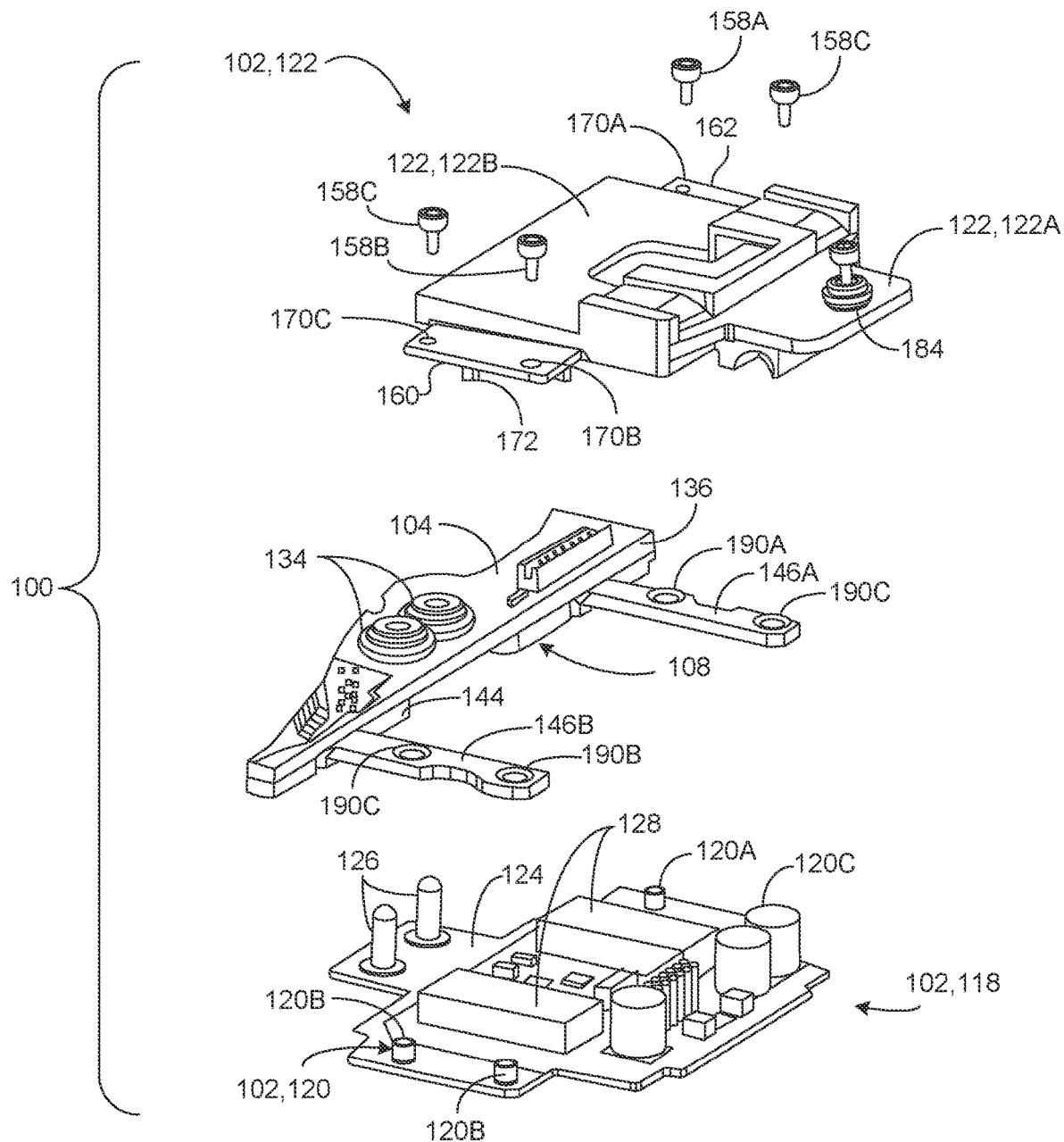
FIG. 10A illustrates an exploded perspective view of a portion of an electronic device of FIGS. 1A-1B according to an example of the present disclosure.
Figure 10B:
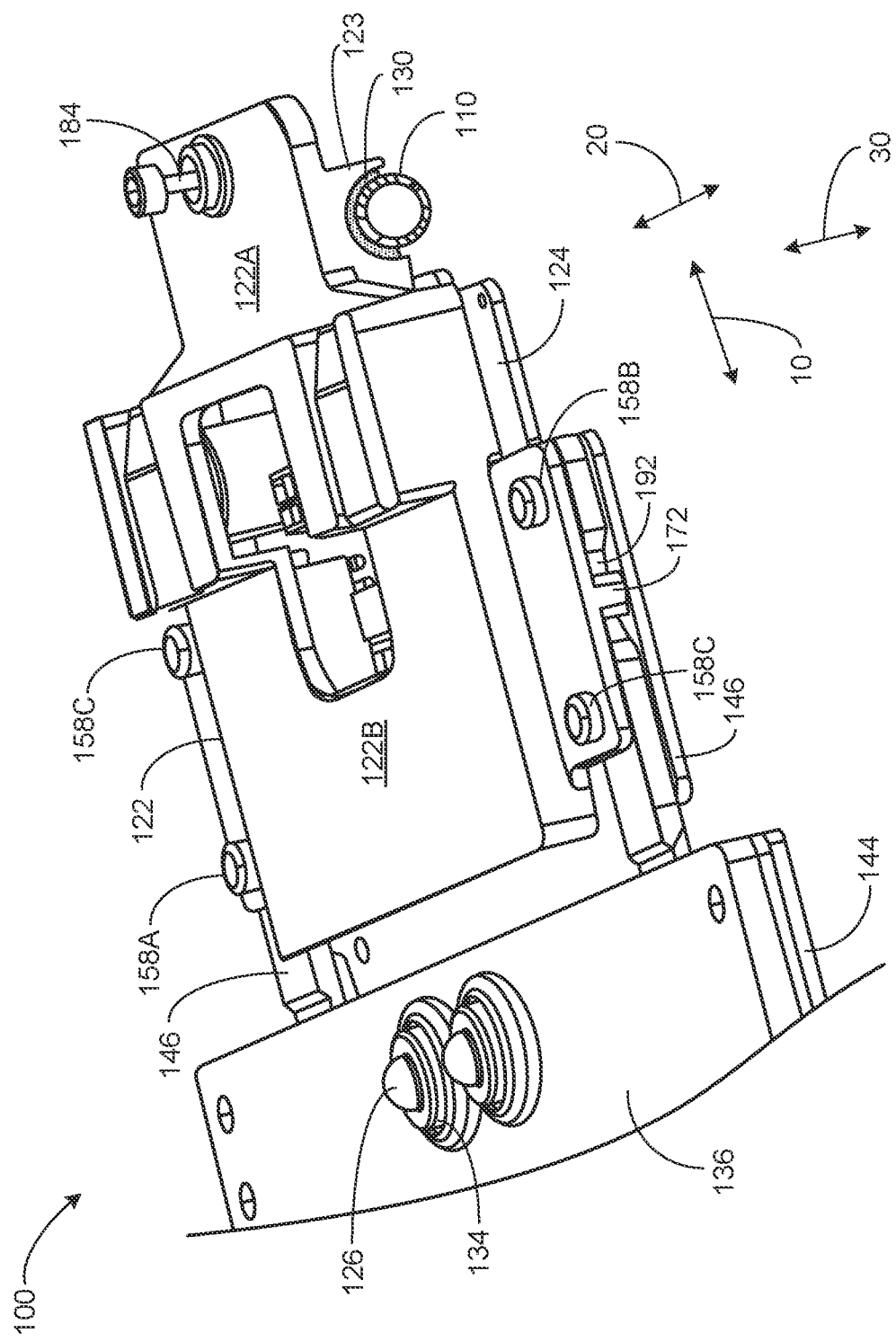
FIG. 10B illustrates an assembled perspective view of the portion of the electronic device of FIG. 10A according to an example of the present disclosure.

The cooling component 122 is a passive heat sink made of thermally conductive materials such as copper, aluminum, or the like. The cooling component 122 includes a first portion 122A having an engagement feature 123 e.g., a semi-circular shaped structure that complements with a complementary engagement feature 111 (e.g., an outer diameter) of the cooling conduit 110 and a second portion 122B having another engagement feature 125 (e.g., a substantially planar shaped structure) that complements with another complementary engagement feature 113 (e.g., an outer surface) of the one or more electronic components 128. The first portion 122A is disposed on the cooling conduit 110 and the second portion 122B is disposed on one or more electronic components 128 of the auxiliary PCA 118. In some examples, the auxiliary module 102 may further include a first thermal interfacing material (TIM) 130 coupled to the first portion 122A of the cooling component 122 and one or more second TIMs 132 coupled to the second portion 122B of the cooling component 122. In such examples, when the cooling component 122 is mounted on the auxiliary PCA 118 and the cooling conduit 110, the first portion 122A may be thermally coupled to the one or more electronic components 128 via the first TIM 130 and the second portion 122B may be thermally coupled to the outer diameter of the cooling conduit 110 via the one or more second TIMs 132. In such examples, the auxiliary module 102 may further include a biasing element (e.g., a captive screw assembly 184, as shown in FIGS. 8, 10A, and 10B) mounted on the cooling component 122 and configured to push the first portion 122A having the semi-circular shaped structure onto the outer diameter of the cooling conduit 110 to thermal couple the cooling component 122 to the cooling conduit 110. It may be noted that in certain other examples, the biasing element may be a snap-fit assembly, a spring assembly, or the like without deviating from the scope of the present disclosure. In some examples, the electrical connector 126 of the auxiliary PCA 118 may be coupled with a complementary electrical connector 134 of the PCA 104 to electrically connect the auxiliary PCA 118 to the PCA 104.

The PCA 104 may be a separate integrated circuit package having a processor circuit board 136, a processing resource 138, a cold plate 140, a complementary electrical connector 134, and a secondary electrical connector 142. In some examples, the processor circuit board 136 may be configured to mechanically support the processing resource 138, the complementary electrical connector 134, and the secondary electrical connector 142, and electrically connect the complementary electrical connector 134 to the processing resource 138 and the secondary electrical connector 142 using conductive pathways, or signal traces or the like (not shown) disposed in the processor circuit board 136. The processing resource 138 e.g., a central processing unit (CPU), graphical processing unit (GPU), System-on-Chip (Soc), or Application Specific Integrated Circuit (ASIC), etc. may be used to process data or information related to the electronic device 100. The complementary electrical connector 134 may be a socket or a sleeve configured to receive the electrical connector 126 of the auxiliary PCA 118, and thereby establish electrically connection by coupling the electrical connector 126 with the complementary electrical connector 134. Further, the complementary electrical connector 134 may transmit the electronic power received via the electrical connector 126 to the processing resource 138 of the PCA 104 and to the secondary electrical connector 142 of the main PCA 108. In certain examples, the secondary electrical connector 142 may transmit the electronic power to one or more electronic elements (not shown) of the main PCA 108. The cold plate 140 is thermally coupled to the processing resource 138 and configured to remove heat from the processing resource 138. In particular, the cold plate 140 includes a fluid inlet 140A coupled to the cooling conduit 110 to receive a cool fluid 148 and circulate the cool fluid 148 within an internal volume (not labeled) of the cold plate 140 to remove heat transferred from the processing resource 138 to the cold plate 140, and thereby generate a hot fluid 150. The cold plate 140 may further include a fluid outlet 140B connected to the internal volume of the cold plate 140 and configured to discharge the hot fluid 150 to a thermal management system (not shown) of the rack, for example.

The support structure 106 is a mechanical component configured to provide mechanical support to the PCA 104 and to the circuit board 124 of the auxiliary module 102. In some examples, the support structure 106 includes a base 144 and a plurality of supporting arms 146 protruding from the base 144 supporting the PCA 104. In particular, the base 144 may support the processor circuit board 136 and the plurality of supporting arms 146 may support the circuit board 124. In one or more examples, each of the plurality of the supporting arms 146 protruding from the base 144 may be disposed between the circuit board 124 and the cooling component 122 of the auxiliary module 102. The support structure 106 is discussed in greater detail below.

The main PCA 108 may be a motherboard of the electronic device 100, which may be configured to support the PCA 104 and the auxiliary PCA 118 via the PCA 104. The main PCA 108 includes a main circuit board 154, one or more electronic elements (not shown), and a tertiary electrical connector 152. The one or more electronic elements and the tertiary electrical connector 152 are mounted on and coupled to the main circuit board 154. In certain examples, the tertiary electrical connector 152 may receive the secondary electrical connector 142 of the main PCA 108 to electrically connect the processor circuit board 136 to the one or more electronic elements of the main PCA 108.

The cooling conduit 110 is configured to receive the cool fluid 148 from the thermal management system and supply the cool fluid 148 to the cold plate 140 of the PCA 104. In some examples, the cooling conduit 110 has a circular shaped structure which complements the semi-circular shaped structure of the first portion 122A of the cooling component 122.

Referring to FIG. 1B, in particular, each of the plurality of supporting arms 146 includes an aperture 190 (e.g., slot) and the cooling component 122 includes a plurality of openings 170. In one example, the plurality of attachment elements 120 is disposed on and coupled to the circuit board 124. In such examples, when the circuit board 124 having the plurality of attachment elements 120 is mounted to the plurality of supporting arms 146, each attachment element of the plurality of attachment elements 120 protrudes through a corresponding aperture 190 in the supporting arms 146. Further, when the second portion 122B of the cooling component 122 is disposed on the circuit board 124 and the plurality of supporting arms 146, each opening of the plurality of openings 170 in the cooling component 122 is aligned with the corresponding attachment element (e.g., standoff or threaded hollow standoff) of the plurality of attachment elements 120. In such examples, each of the plurality of supporting arms 146 is disposed between the cooling component 122 and the circuit board 124. The plurality of fasteners 158 may then be inserted through the plurality of openings 170 and into the plurality of attachment elements 120 to attach the cooling component 122 to the circuit board 124 of the auxiliary PCA 118 and to the plurality of supporting arms 146. That is, in the example of FIG. 1B, the supporting arms 146 are sandwiched between the cooling component 122 and the circuit board 124, with the attachment elements 120 retaining the supporting arms 146 in this position. In particular, when the auxiliary module 102 is installed in the electronic device 100, the electrical connector 126 (see FIG. 1A) may be coupled to the complementary electrical connector 134 (see FIG. 1A) to establish electrical connection between the auxiliary module 102 and the PCA 104, and the plurality of fasteners 158 may engage with the plurality of attachment elements 120 to attach the auxiliary module 102 to the plurality of supporting arms 146, and the auxiliary PCA 118 to the cooling component 122. Accordingly, in such examples, in the installed state of the auxiliary module 102 in the electronic device 100, the first portion 122A of the cooling component 122 is thermally coupled to the cooling conduit 110. Similarly, in the attached state of the cooling component 122 to the auxiliary PCA 118, the second portion 122B of the cooling component 122 is thermally coupled to the one or more electronic components 128.

Further, in the attached state of the auxiliary module 102 to the plurality of supporting arms 146 and the coupled state of the electrical connector 126 with the complementary electrical connector 134, the auxiliary module 102 is movable in one or more degrees of freedom of motion relative to the plurality of supporting arms 146 to overcome issues related to tolerance stack up in the cooling conduit 110. For example, in some implementations the auxiliary module 102 can be translated (within defined limits) relative to the support arms 146 along one or more directions (e.g., a longitudinal direction 10, a lateral direction 20, and/or a vertical direction 30). Furthermore, in some examples, the auxiliary module 102 is not only movable in translation but may also be rotatable (within defined limits) about one more axes of rotation, such as about an axis parallel to the lateral direction 20, an axis parallel to the vertical direction 30, and/or an axis parallel to the longitudinal direction 10. In some examples, the auxiliary module 102 is rotatable about an axis 121 which is parallel to the vertical direction 30, and such rotation may also be referred to herein as motion or rotation in a radial direction.

The translational and/or rotational motion of the auxiliary module 102 relative to the supporting arms may be facilitated in part by the configuration of the electrical interface (e.g., the electrical connectors 134 are configured to allow motion of the electrical connectors 126 while connected) and in part by the apertures 158 and/or the openings 170 being oversized in at least one dimension thereof to allow for movement of the attachment members 120 relative to the support arms and/or to allow for movement of the fasteners 158 relative to the cooling component 122. In addition, in some examples, a spacing between the cooling component 122 and the circuit board 124 may exceed the thickness of the supporting arms 146, which may facilitate motion along the vertical direction 30 and/or rotation about axes parallel to the longitudinal and/or lateral dimensions 10, 20. The spacing between the cooling component 122 and the circuit board 124 may be controlled by the attachment members 120 and fasteners.

Although the auxiliary module 102 as a whole may be movable relative to the support arms 146, in some examples the circuit board 124 may be fixed relative to the cooling component 122 once assembled. However, during various stages of assembly the circuit board 124 and the cooing component 122 may move relative to one another to facilitate the assembly. For example, the above described oversizing of the openings 170 and/or apertures 190 may facilitate such motion of the circuit board 124 relative to the cooling component 122 during assembly.

In the example of FIG. 1B, the circuit board 124 and the cooling component 122 are both directly coupled to the support arms 146 and to one another via a single set of fasteners 158 and attachment members 120. But in other examples, the connections between the components of the auxiliary module 102 may differ. For example, FIG. 2 (described below) illustrates an example in which the circuit board is coupled directly to the support arms and to the cooling component using two different sets of fasteners and attachment members, whereas the cooling component is not directly connected to the support arms (the cooling component is instead indirectly connected to the support arms via the circuit board). As another example, FIG. 3 (described below), illustrates an example in which the cooling component is coupled directly to the support arms and to the circuit board using two different sets of fasteners and attachment members, whereas the circuit board is not directly connected to the support arms (the circuit board is instead indirectly connected to the support arms via the cooling component).

Figure 2:
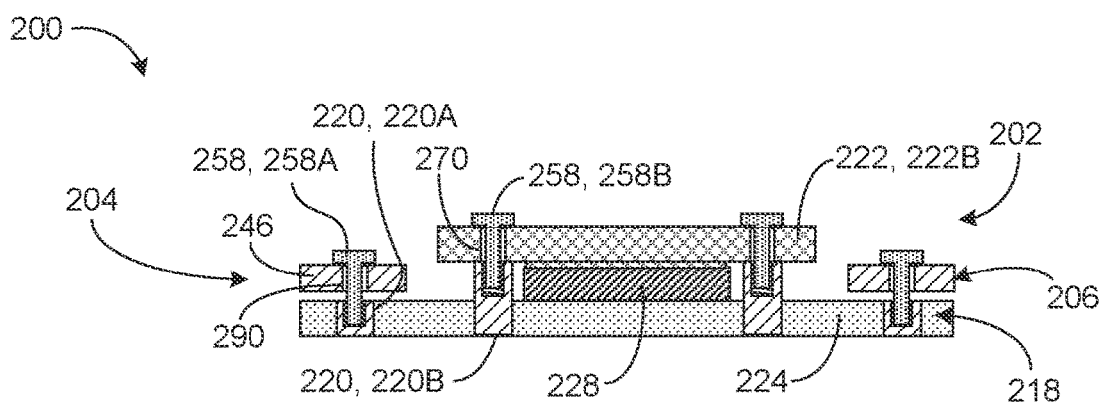
FIG. 2 illustrates a block diagram of an auxiliary module attached to a PCA according to another example of the present disclosure.

FIG. 2 depicts a block diagram of an auxiliary module 202 attached to a PCA 204 of an electronic device 200. In one or more examples, each of a plurality of supporting arms 246 of a support structure 206, protruding from the PCA 204 includes an aperture 290 and a cooling component 222 includes a plurality of openings 270. In some examples, a plurality of attachment elements 220 having a first set of attachment elements 220A and a second set of attachment elements 220B is disposed on and coupled to the circuit board 224. In such examples, when the circuit board 224 having the plurality of attachment elements 220 is mounted to the plurality of supporting arms 246, the first set of attachment elements 220A protrudes through a corresponding aperture 290. Further, when a second portion 222B of the cooling component 222 is disposed on the circuit board 224, each opening of the plurality of openings 270 in the cooling component 222 is aligned with the second set of attachment elements 220B. In one or more examples, the auxiliary module 202 may further include a plurality of fasteners 258 having a first set of fasteners 258A and a second set of fasteners 258B. Each of the first set of fasteners 258A may extend into the first set of attachment elements 220A to attach the auxiliary module 202 to the PCA 204 (or in particular, attach an auxiliary PCA 218 to the plurality of supporting arms 246). In such examples, the auxiliary module 202 may be movable along one or more directions relative to the plurality of supporting arms 246 to overcome issues related to tolerance stack up in the cooling loop (not shown). More specially, the circuit board 224 is movable relative to the support arms 246. Similarly, each of the second set of fasteners 258B may extend through the plurality of openings 270 in the cooling component 222 to attach the cooling component 222 to the circuit board 228 of the auxiliary PCA 218. In the example of FIG. 2, the cooling component 222 is fixed relative to the circuit board 224 once assembled. However, during various stages of assembly the circuit board 224 and the cooing component 222 may move relative to one another to facilitate the assembly.

Figure 3:
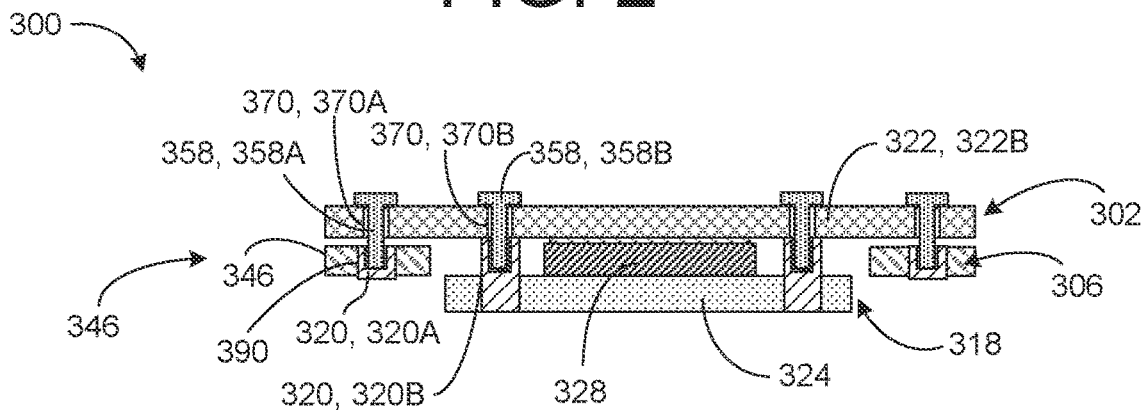
FIG. 3 illustrates a block diagram of an auxiliary module attached to a PCA according to yet another example of the present disclosure.

FIG. 3 depicts a block diagram of an auxiliary module 302 attached to a PCA 304 of an electronic device 300. In one or more examples, each of a plurality of supporting arms 346 of a support structure 306, protruding from the PCA 304 includes an aperture 390 and a cooling component 322 includes a plurality of openings 370 including a first set of openings 370A and a second set of openings 370B. In some examples, a plurality of attachment elements 320 includes a first set of attachment elements 320A and a second set of attachment elements 320B. The first set of attachment elements 320A is disposed on and coupled to the cooling component 322 and the second set of attachment elements 320B is disposed on and coupled to the circuit board 324. In such examples, when the cooling component 322 having the first set of attachment elements 320A is mounted to the plurality of supporting arms 346, the first set of attachment elements 320A protrudes through a corresponding aperture 390. Further, when a second portion 322B of the cooling component 322 is disposed on the circuit board 324, the first set of openings 370A is aligned with the first set of attachment elements 320A and the second set of attachment elements 320B protrudes through a corresponding opening of the second set of openings 370B. In one or more examples, the auxiliary module 302 may further include a plurality of fasteners 358 having a first set of fasteners 358A and a second set of fasteners 358B. Each of the first set of fasteners 358A may extend through the first set of openings 370A and into the first set of attachment elements 320A to attach the auxiliary module 302 to the PCA 304 (or in particular, attach an auxiliary PCA 318 to the plurality of supporting arms 346). In such examples, the auxiliary module 302 may be movable along one or more directions relative to the plurality of supporting arms 346 to overcome issues related to tolerance stack up in the cooling loop (not shown). More specially, the cooling component 322 is movable relative to the support arms 346. Similarly, each of the second set of fasteners 358B may extend through the second set of openings 370B in the cooling component 322 to attach the cooling component 322 to the circuit board 228 of the auxiliary PCA 218. In the example of FIG. 3, the cooling component 322 is fixed relative to the circuit board 324 once assembled. However, during various stages of assembly the circuit board 324 and the cooing component 322 may move relative to one another to facilitate the assembly.

Figure 4A:
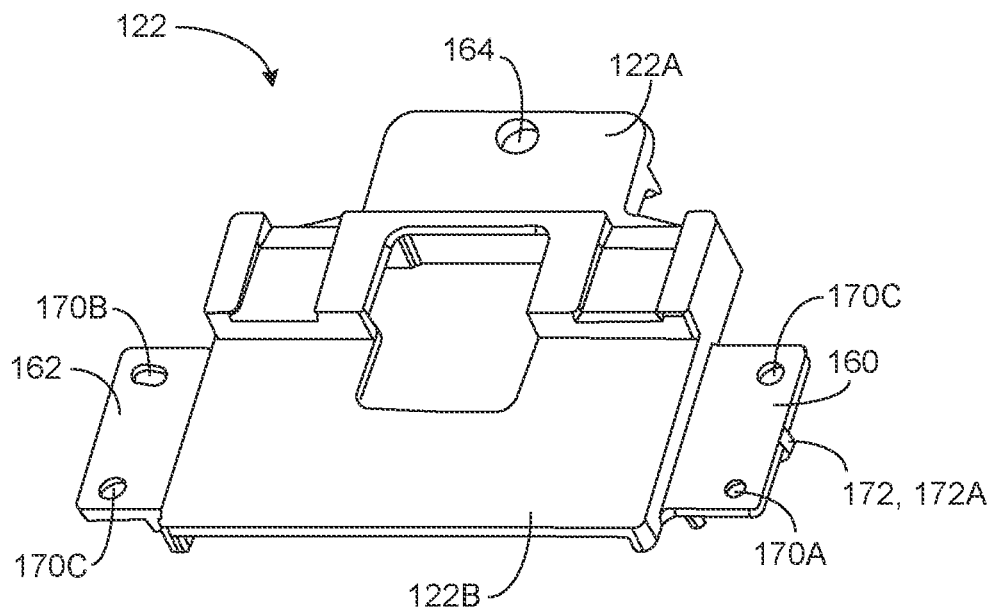
FIG. 4A illustrates a perspective top view of a cooling component of the auxiliary module of FIGS. 1A-1B according to an example of the present disclosure.
Figure 4B:
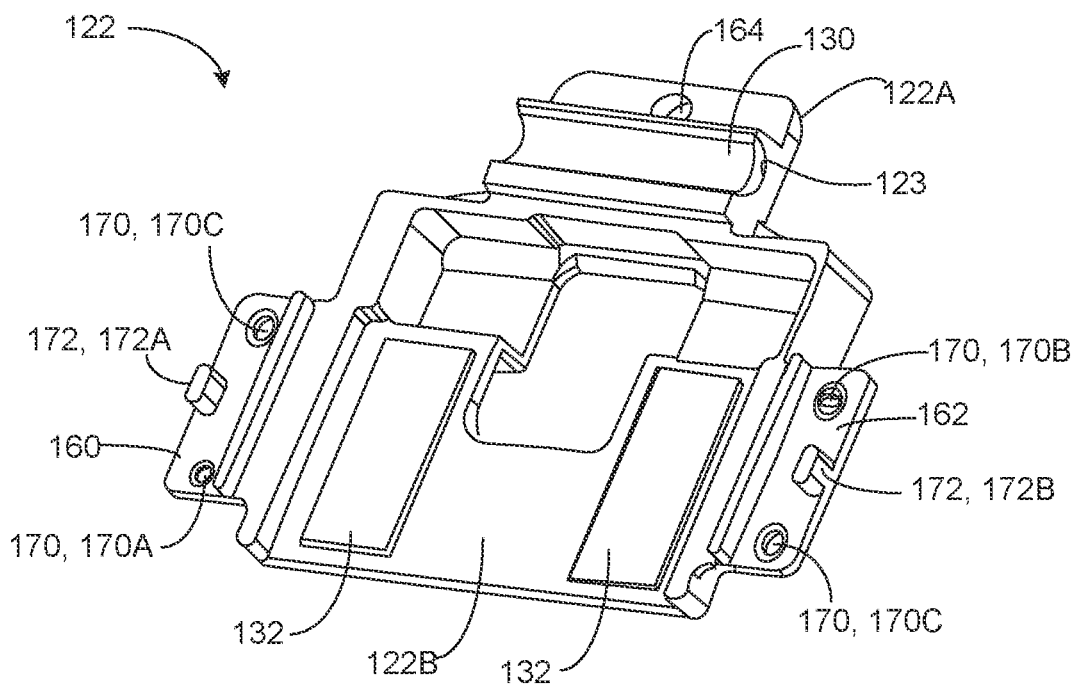
FIG. 4B illustrates a perspective bottom view of the cooling component of FIG. 4A according to an example of the present disclosure.
Figure 4C:
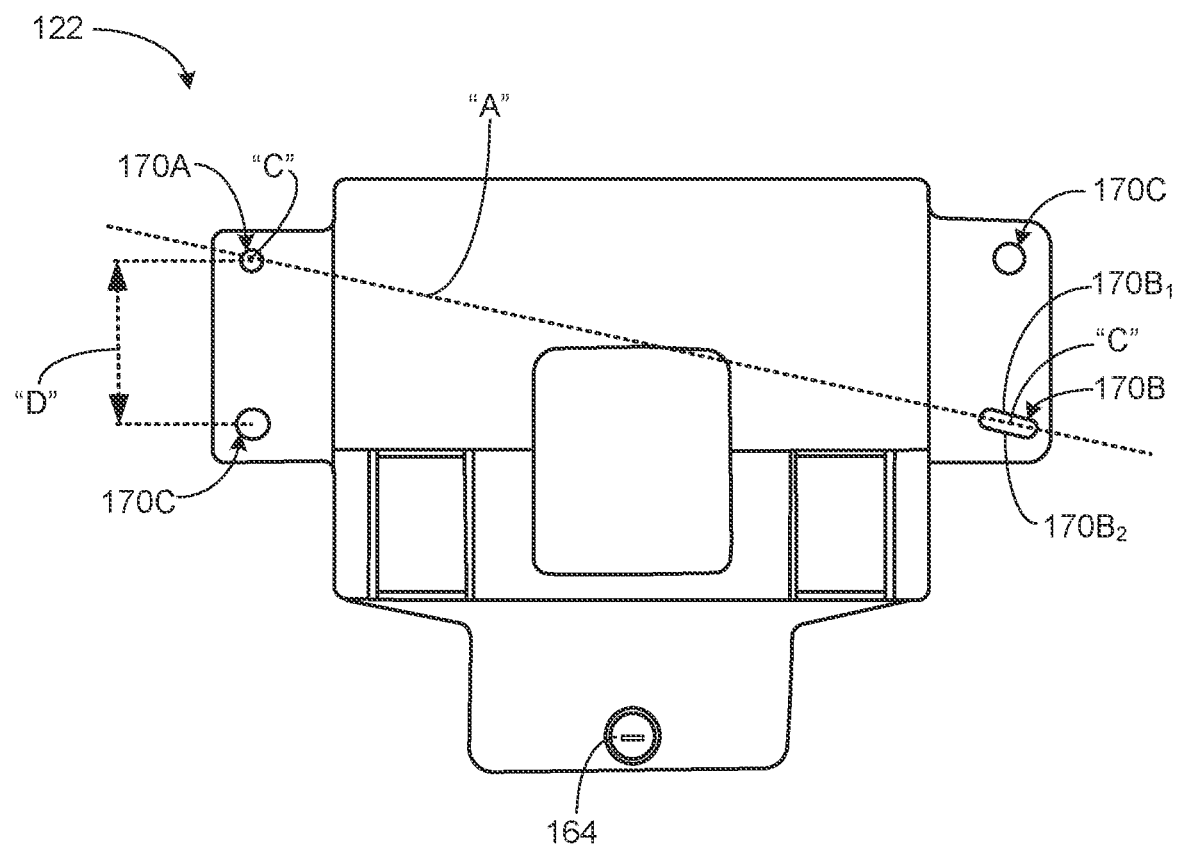
FIG. 4C illustrates a top view of the cooling component of FIG. 4A according to an example of the present disclosure.

FIG. 4A depicts a perspective top view of a cooling component 122 of an auxiliary module 102, which is one example configuration of the cooling component of FIGS. 1A-1B. FIG. 4B depicts a perspective bottom view of the cooling component 122 of FIG. 4A. FIG. 4C depicts a perspective bottom view of the cooling component 122 of FIG. 4A. In the description hereinafter, FIGS. 4A-4C are described concurrently for ease of illustration.

The cooling component 122 includes a first portion 122A and a second portion 122B extending from the first portion 122A. Further, the cooling component includes a first flange 160 and a second flange 162 extending from opposite ends of the second portion 122B. The first portion 122A has an engagement feature 123 that complements with a complementary engagement feature 111 (See, FIG. 1A) of the cooling conduit 110. In some examples, the engagement feature 123 forms a track or groove having a similar profile in cross-section as the cooling conduit 110, and the cooling conduit 110 may be disposed in this track or groove such that the engagement feature 123 (See, FIG. 1A) at least partially surrounds the cooling conduit 110, in a cross-section (e.g., the engagement feature 123 may surround a top half, top third, top quarter, or some other portion of the cooling conduit 110). In particular, in some examples the cooling conduit 110 is cylindrical in shape and the complementary engagement feature 111 thereof may be a portion (e.g., the top half) of the outer diameter of the cooling conduit 110 along a particular length thereof, and in these examples the engagement feature 123 may comprise a curved engagement surface which has an arched or semi-circular shape in cross-section so as to receive and engage with the outer diameter of the cooling conduit 110 (either direction, or via a TIM 130). The first portion 122A further includes a biasing element (e.g., a captive screw assembly 184). In particular, the first portion 122A includes a captive screw hole 164 to allow mounting of the captive screw assembly 184 on to the cooling component 122. The auxiliary module 102 includes a first TIM 130 coupled to the first portion 122A. In particular, the first TIM 130 is coupled to a portion of an inner surface of the first portion 122A of the cooling component 122 which may be thermally coupled to the circular shaped cooling conduit 110. In particular, the first portion 122A is configured to thermally couple with the cooling conduit 110 via the first TIM 130. The second portion 122B has a generally planar shape that complements an outer surface of one or more electronic components 128 (see FIG. 1A). The auxiliary module 102 may further include one or more second thermal interface materials (TIMs) 132 coupled to the second portion 122B. In particular, the one or more second TIMs 132 is coupled to another portion of the inner surface of the second portion 122B which may be thermally coupled to the one or more electronic components 128. In particular, the second portion 122B is configured to thermally couple with the one or more electronic components 128, directly or via the one or more second TIMs 132.

Figure 9:
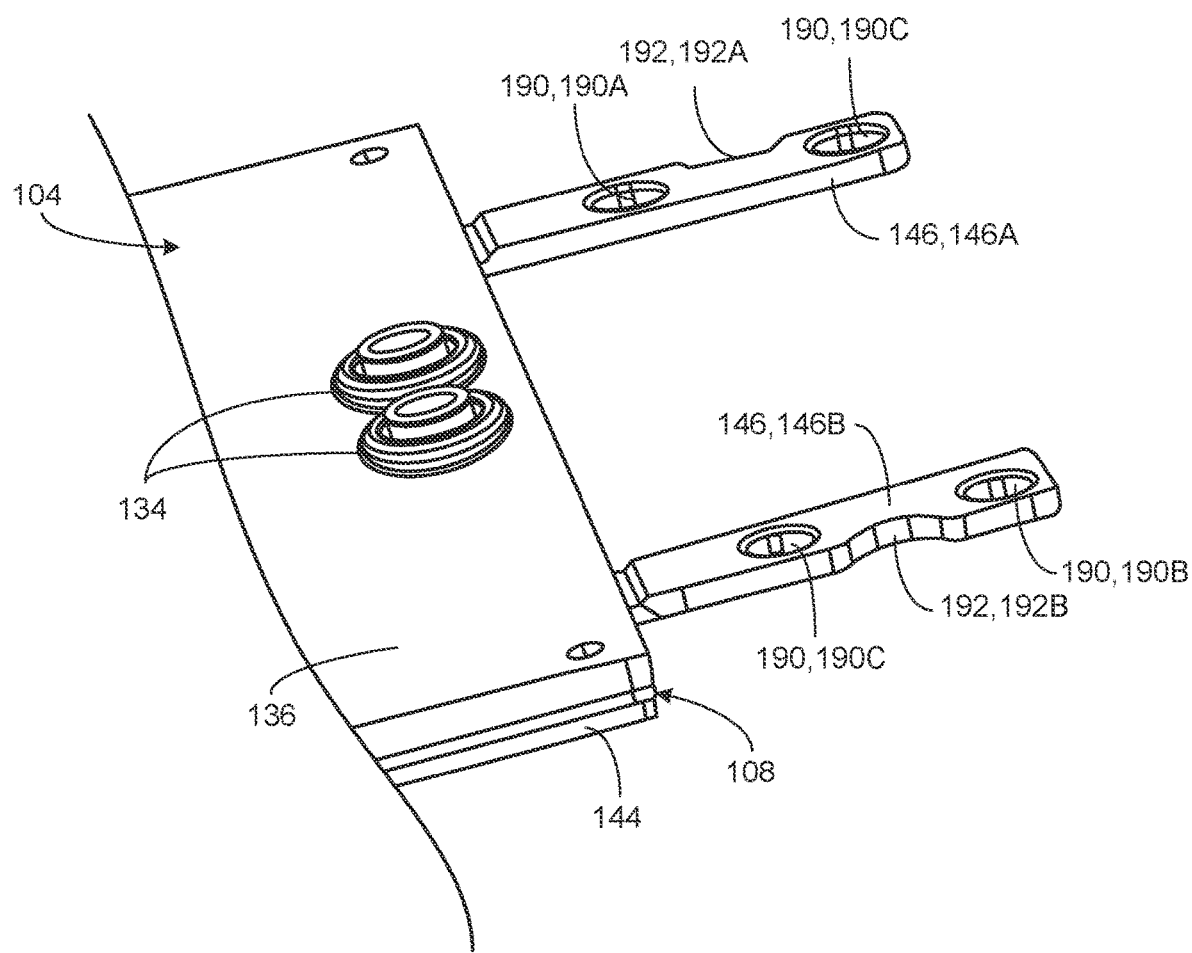
FIG. 9 illustrates a perspective view of a portion of the PCA of FIGS. 1A-1B according to an example of the present disclosure.

The cooling component 122 further includes a plurality of openings 170. In particular, the plurality of openings 170 includes a first opening 170A, a second opening 170B, and a pair of third openings 170C. In some examples, the first opening 170A and one opening among the pair of third openings 170C are formed in the first flange 160. Similarly, the second opening 170B and another opening among the pair of third openings 170C are formed in the second flange 162. In some examples, the first opening 170A and the second opening 170B are formed on diagonally opposite sides of the first flange 160 and the second flange 162. Similarly, the pair of third openings 170C are formed on another diagonally opposite sides of the first flange 160 and the second flange 162. Further, in some examples, the second opening 170B may be an elongated slot having long edges 170B$_1$ and 170B$_2$ that extends parallel to an axis "A" extending between centers "C" of the first opening 170A and the second opening 170B. Further, each of the first opening 170A and one opening among the pair of third openings 170C and the second opening 170B and the other opening among the pair of third openings 170C are disposed spaced apart from each other by a distance "D". The first opening 170A has a diameter which is smaller than the diameter of each of the second opening 170B and the third pair of openings 170C. The pair of third openings 170C has a diameter smaller than the diameter of the second opening 170B. In some examples, the second portion 122B further includes protrusions 172. In particular, a first protrusion 172A is located between the first opening 170A and one opening among the pair of third openings 170C and coupled to the first flange 160. Similarly, a second protrusion 172B is located between the second opening 170B and other opening among the pair of third openings 170C and coupled to the second flange 162. Each of the protrusions 172 is configured to extend via a notch (as shown in FIG. 9) formed in the supporting arms 146 and contact the circuit board 124 to limit over constraining of each of the plurality of fasteners 158 while coupling the cooling component 122 and the auxiliary PCA 118 to each other.

Figure 5:
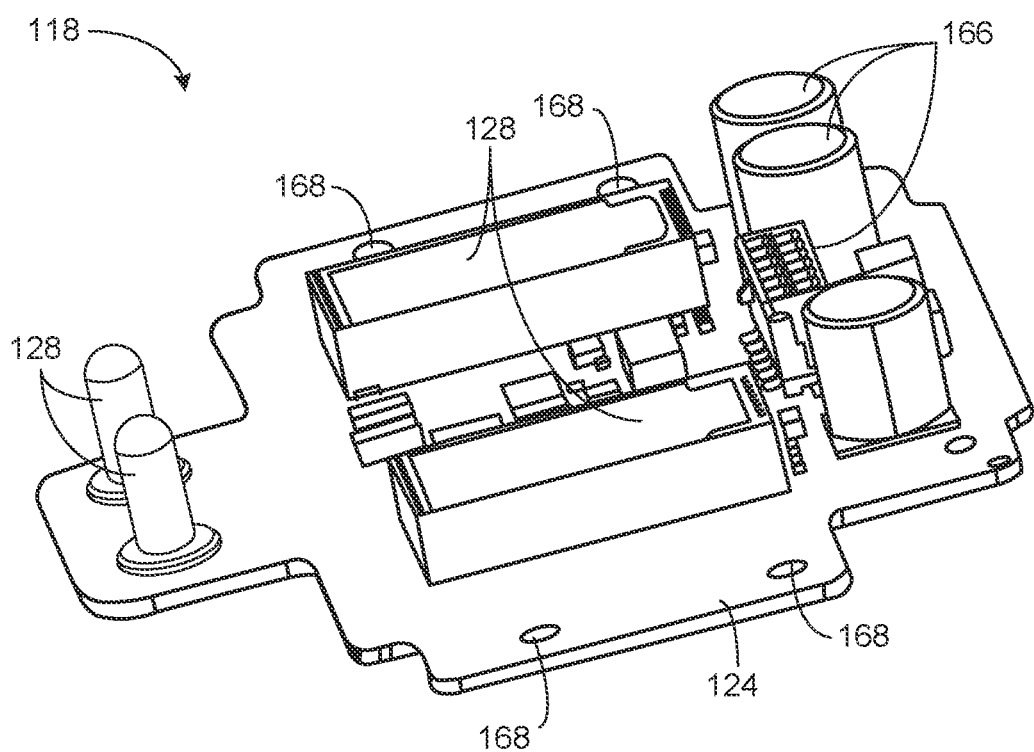
FIG. 5 illustrates a perspective view of an auxiliary PCA of the auxiliary module of FIGS. 1A-1B according to an example of the present disclosure.

FIG. 5 depicts a perspective view of an auxiliary PCA 118 of an auxiliary module 102 of FIGS. 1A-1B. In some examples, the auxiliary PCA 118 includes a circuit board 124, electrical connectors 126, one or more electronic components 128, one or more electronic elements 166, and one or more holes 168. The circuit board 124 may be configured to mechanically support the electrical connectors 126, the one or more electronic components 128, and the one or more electronic elements 166. In particular, each of the electrical connectors 126, the one or more electronic components 128, and the one or more electronic elements 166 are disposed on and coupled to the circuit board 124. In some examples, one of the electronic elements 166 may be electrically connected to the first pair of wires 114 (see FIG. 1A) and to the one or more electronic components 128 via one of conductive pathways, or signal traces or the like (not shown) disposed in the circuit board 124. The one or more electronic components 128 may be further electrically connected to the electrical connectors 126. In some examples, the electrical connector 126 may be a power pin and each of the electronic components 128 may be a voltage regulator. In some examples, the one or more electronic components 128 may step-down the relatively low voltage direct current to a low voltage direct current and transmit the low voltage direct current to the electrical connectors 126. During such operations, the one or more electronic components 128 may generate heat, which needs to be transferred out of the auxiliary PCA 118 to prevent component failure due to overheating condition and obtaining optimum performance from the one or more electronic components 128 The one or more electronic components 128 and the one or more electronic elements 166 may be housed inside the second portion 122B of the cooling component 122. In such examples, the second portion 122B may be thermally coupled to the one or more electronic components 128 via the one or more second TIMs 132. The one or more holes 168 may be configured to receive a corresponding attachment element among the plurality of attachment elements 120 and couple the received attachment element 120 to the circuit board 124 of the auxiliary PCA 118. For example, the holes 168 may comprise threading which engages with threading of the attachment elements 120 to secure the attachment element 120 to the circuit board 124. As another example, the attachment element 120 may be inserted into the holes 168 and coupled thereto via friction fitting, adhesive, welding, or any other attachment method.

Figure 6:
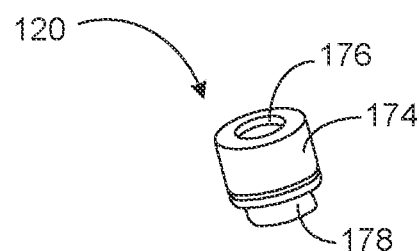
FIG. 6 illustrates a perspective view of an attachment element of the auxiliary module of FIGS. 1A-1B according to an example of the present disclosure.

FIG. 6 depicts a perspective view of one of a plurality of attachment elements 120 of an auxiliary module 102 of FIGS. 1A-1B. In some examples, the attachment element 120 may be a standoff having a cylindrical portion 174, a coupler portion 178, and a hole 176 having threads (not shown) defined there through the cylindrical portion 174 and the coupler portion 178 for receiving a corresponding fastener among the plurality of fasteners 158 having counter threads (not shown). The coupler portion 178 is configured to protrude into the corresponding hole among the plurality of holes 168 in the circuit board 124 to couple the attachment element 120 to the auxiliary PCA 118.

Figure 7:
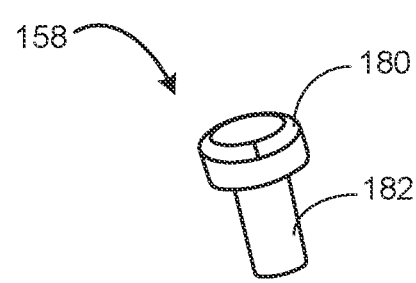
FIG. 7 illustrates a perspective view of a fastener of the auxiliary module of FIGS. 1A-1B according to an example of the present disclosure.

FIG. 7 depicts a perspective view of one fastener among the plurality of fasteners 158 of an auxiliary module 102 of FIGS. 1A-1B. The fastener 158 may include a head portion 180 and a body portion 182 having counter threads (not shown). In one or more examples, the fastener 158 may extend in one of a corresponding opening 170 of the cooling component 122 or the attachment element 120 to attach the auxiliary module 102 to the supporting arms 146 and auxiliary PCA 118 to the cooling component 122.

FIG. 8 depicts a perspective view of a biasing element, e.g., a captive screw assembly 184 of the cooling component 122. It may be noted that the cooling component 122 may include other types of biasing element such as a snap-fit assembly, a spring assembly, or the like without deviating from the scope of the present disclosure. The captive screw assembly 184 is a special type of screw assembly that may remain freely inside an opening of an object without getting lost from the object, and at the same time it may be selectively fastened or unfastened to lock to or unlock from another object. In some examples, the captive screw assembly 184 includes a captive screw 186 and a coupler object 188. The coupler object 188 may be disposed on the captive screw hole 164 formed in the first portion 122A of the cooling component 122. Thus, the captive screw 186 may remain freely inside an opening (not labeled) of the coupler object 188 without getting lost from the coupler object 188 and may be fastened to push the first portion 122A on the cooling conduit 110 to thermally couple the first portion 122A to the cooling conduit 110.

FIG. 9 depicts a perspective view of a portion of the PCA 104 and the support structure 106 of FIGS. 1A-1B. In some examples, the PCA 104 includes a processor circuit board 136 and complementary electrical connectors 134. It may be noted that a processing resource 138, a cold plate 140, and a secondary electrical connector 142 are not visible in the view shown in FIG. 9 and those components are shown in the example of FIG. 1A. In some examples, the complementary electrical connectors 134 e.g., sockets or sleeves are mounted on and coupled to the processor circuit board 136. Further, the processor circuit board 136 may include one of conductive pathways, or signal traces or the like (not shown) for connecting each of the complementary electrical connectors 134 to the processing resource 138 and the secondary electrical connector 142.

In some examples, the support structure 106 is a mechanical component having a base 144 and a plurality of supporting arms 146 including a first supporting arm 146A and a second supporting arm 146B, each protruding from the base 144. In some examples, the base 144 supports the processor circuit board 136 and the plurality of supporting arms 146 supports the circuit board 124 of the auxiliary PCA 118. In some examples, each supporting arm of the plurality of supporting arms 146 includes apertures 190, e.g., the apertures 190 includes a first aperture 190A, a second aperture 190B, and a pair of third apertures 190C, and a notch 192, e.g., a first notch 192A and a second notch 192B. In some examples, the first supporting arm 146A includes a first aperture 190A and one aperture among the pair of third apertures 190C. Similarly, the second supporting arm 146B includes a second aperture 190B and another aperture among the pair of third apertures 190C. The first aperture 190A and the second aperture 190B are formed on diagonally opposite sides of the first supporting arm 146A and the second supporting arm 146B. Similarly, the pair of third apertures 190C are formed on another diagonally opposite sides of the first supporting arm 146A and the second supporting arm 146B. In one or more examples, each of the first aperture 190A, the second aperture 190B, and the pair of third apertures 190C may be a slot (oversized slot) and has a width greater than a diameter of the corresponding attachment element among the plurality of attachment elements 120 to allow the cooling component 122 and the auxiliary PCA 118 (e.g., the auxiliary module 102) to move as an unit along one or more directions relative to the plurality of supporting arms 146 to align the first portion 122A of the cooling component 122 on the cooling conduit 110 and thermally couple the first portion 122A to the cooling conduit 110 and the second portion 122B to the one or more electronic components 128. The first notch 192A is formed in the first supporting arm 146A between the first aperture 190A and one aperture among the pair of third apertures 190C. Similarly, the second notch 192B is formed in the second supporting arm 146B between the other aperture among the pair of third apertures 190C and the second aperture 190B.

FIG. 10A depicts an exploded perspective view of the electronic device 100. FIG. 10B depicts an assembled perspective view of the electronic device 100. In the description hereinafter, FIGS. 10A-10B are described concurrently for ease of illustration.

The electronic device 100 shown in the example of FIG. 10A includes an auxiliary module 102, a PCA 104, and a support structure 106. The auxiliary module 102 includes an auxiliary PCA 118, a plurality of attachment elements 120, a cooling component 122, a plurality of fasteners 158, and a captive screw assembly 184. The auxiliary PCA 118 includes a circuit board 124, electrical connectors 126 e.g., power pins, and one or more electronic components 128. The electrical connectors 126 and the one or more electronic components are coupled to the circuit board 124. In some examples, each of the plurality of attachments elements is a standoff including a recess or hole therein and threads defined there through the hole. Further, the plurality of attachment elements 120 are also coupled to the circuit board 124. The cooling component 122 includes a first portion 122A and a second portion 122B. The captive screw assembly 184 is coupled to the first portion 122A. The second portion 122B includes a plurality of openings 170, e.g., a first opening 170A, a second opening 170B, and a pair of third openings 170C. In some examples, the second portion 122B further includes protrusions 172. The plurality of fasteners 158 includes a first fastener 158A, a second fastener 158B, and a pair of third fasteners 158C. In the example of FIG. 1A, the PCA 104 includes a processor circuit board 136 and complementary electrical connectors 134 e.g., sockets coupled to the processor circuit board 136. The support structure 106 includes a base 144 and a plurality of supporting arms 146, e.g., a first supporting arm 146A and a second supporting arm 146B. In one or more examples, each of the plurality of supporting arm 146 protrudes from the base 144. The base 144 supports the processor circuit board 136. Each of the plurality of supporting arms 146 includes apertures 190, e.g., a first aperture 190A, a second aperture 190B, and a pair of third apertures 190C.

A process of assembling the auxiliary module 102 and coupling the auxiliary module to the supporting arms 146 and the cooling conduit 110 will now be described. The process begins by positioning the auxiliary PCA 118 below the PCA 104 and the support structure 106 such that the electrical connectors 126 are aligned to the complementary electrical connectors 134, the first attachment element 120A is aligned with the first aperture 190A, the second attachment element 120B is aligned with the second aperture 190B, the pair of third attachment elements 120C are aligned with the pair of third apertures 190C. The auxiliary PCA 118 is then electrically coupled to the PCA 104 by mating the electrical connectors 126 with the complementary electrical connectors 134. As part of moving the PCA 118 to establish the electrical coupling, the attachment elements 120 may also be caused to extend through the apertures 190 in the supporting arms 146.

Next, the cooling component 122 is positioned over the auxiliary PCA 118 and the cooling conduit 110 such that the first portion 122A is disposed on the cooling conduit 110 and a second portion 122B is disposed on one or more electronic components 128. In this state, the plurality of supporting arms 146 are located between the auxiliary PCA 119 and the cooling component 122, and the openings 170 may be roughly aligned with corresponding apertures 190 and the attachment elements 120 disposed therein (e.g., first opening 170A is aligned with the first aperture 190A, the second opening 170B is aligned with the second aperture 190B, and the pair of third openings 170C are aligned with the pair of third apertures 190C). Further, in this state, in one or more examples, each protrusion 172 in the cooling component 122 extends via the notch 192 in the corresponding supporting arm 146 and contact the circuit board 124.

The cooling component 122 may then be engaged with and coupled to the cooling conduit 110, which fixes the location of the cooling component 122. At this point, the cooling component 122 might not be perfectly aligned with the circuit board 124 because the location and orientation of the cooling conduit 110 relative to the PCA 104 may vary slightly from the nominal designed location due to the tolerance stack up. However, the circuit board 124 can be moved relative to the supporting arms 124 to bring it into alignment with the cooling component 120 because the apertures 190 are oversized relative to the attachment members. The fasteners 158 may be inserted through the openings 170 into the attachment members 120 and fastened, which will hold the circuit board 124 in the aligned position. In some examples, the order in which fasteners 158 are fastened may have an effect on how the auxiliary module 102 moves, and a particular order may be beneficial in some contexts. In particular, in some examples the fastening of the to the plurality of attachment elements 120 may proceed as follows: i) the circuit board 124 is moved along the XY directions (longitudinal direction 10 and lateral direction 20) until the first opening 170A aligns with the first attachment element 120A and then the first fastener 158A may be engaged with the first attachment element 120A and fastened, which constrains the XY position of circuit board 124 relative to the cooling component 122, ii) the circuit board 122 may be rotated about a vertical axis (e.g., pivoted about the first fastener 158A) until the second opening 170B is aligned with the second attachment element 120B and then the second fastener 158B may be inserted through the second opening 170B into the second attachment element 120 and fastened, which constrains the orientation of the circuit board relative to the cooling component 122, and iii) the pair of third fasteners 158C are then inserted into the pair of third openings 170C and the pair of third attachment elements 120C and fastened to pull the circuit board 124 and the cooling component 122 closer together along the vertical direction 30 and thereby causing the second portion 122B to thermally coupled with the one or more electronic components 128 (e.g., compressing a TIM disposed therebetween). In one or more examples, the protrusion 172 contacting the circuit board 124 may limit over constraining of each of the plurality of fasteners 158 while coupling the cooling component 122 and the auxiliary PCA 118 to each other. In some examples, the captive screw assembly 184 is further fastened to push the semi-circular shaped structure formed in the first portion 122A onto the outer diameter of the cooling conduit 110 to thermally couple the cooling component 122 to the cooling conduit 110. In some examples, the first portion 122A is thermally coupled with the cooling conduit 110 via the first TIM 130 coupled to the first portion 122A. Similarly, the second portion 122B is thermally coupled with the one or more electronic components 128 via the second TIMs 132 coupled to the second portion 122B.

Figure 11:
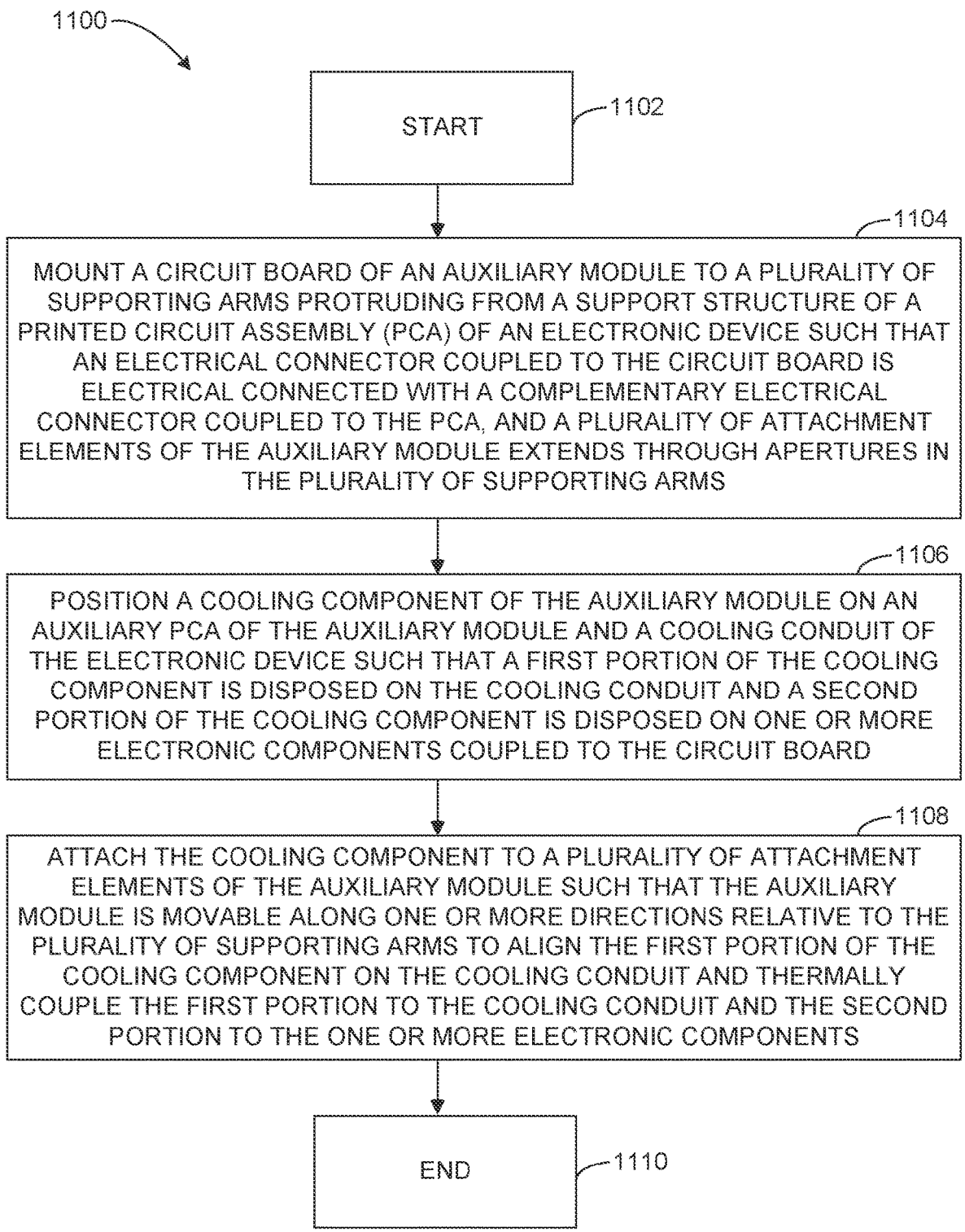
FIG. 11 is a flowchart depicting a method of assembling an auxiliary module to a PCA of an electronic device according to one example of the present disclosure.

FIG. 11 depicts a flowchart depicting a method 1100 of assembling an auxiliary module to a PCA of an electronic device. It may be noted herein that the method 1100 is described in conjunction with FIGS. 1A-1B, 4A-4C, 5-9, and 10A-10B for example. The method 1100 starts at block 1102 and continues to block 1004.

At block 1104, the method 1100 includes mounting a circuit board of an auxiliary module to a plurality of supporting arms protruding from a support structure of a printed circuit assembly (PCA) of an electronic device such that an electrical connector coupled to the circuit board is electrical connected with a complementary electrical connector coupled to the PCA, and a plurality of attachment elements of the auxiliary module extends through apertures (slots) in the plurality of supporting arms. The method 1100 continues to block 1106.

The method 1100 continues to block 1106. The method 1100 includes positioning a cooling component of the auxiliary module on an auxiliary PCA of the auxiliary module and a cooling conduit of the electronic device such that a first portion of the cooling component is disposed on the cooling conduit and a second portion of the cooling component is disposed on one or more electronic components coupled to the circuit board. The method 1100 continues to block 1108.

At block 1108, the method 1100 includes attaching the cooling component to a plurality of attachment elements of the auxiliary module such that the auxiliary module is movable along one or more directions relative to the plurality of supporting arms to align the first portion of the cooling component on the cooling conduit and thermally couple the first portion to the cooling conduit and the second portion to the one or more electronic components. In some examples, a biasing element e.g., a captive screw assembly disposed on the first portion is first fastened to partially install the cooling component on the cooling conduit. Further, first fastener among the plurality of fasteners may be extended through a first opening of the cooling component and the corresponding attachment element and tightened to fix the cooling component onto the auxiliary PCA and provide the accurate XY tolerance control to link the two parts together. This positioning feature starts aligning the floating auxiliary PCA into place. Further, a second fastener among the plurality of fasteners may be extended through a second opening (e.g., elongated slot) of the cooling component and the corresponding standoff and tightened to restrain rotation of the auxiliary module about the Z direction and thereby completing the alignment of the auxiliary module. Later, a third pair of fasteners among the plurality of fasteners may be extended through a pair of third openings and served to form a robust connection between the cooling component and the auxiliary PCA. Finally, the captive fastener assembly may be further tightened to push the half circle channel of the cooling component onto the cooling conduit to fully install the cooling component on the cooling conduit. In one or more examples, the first portion of the cooling component is thermally coupled with the cooling conduit via a first thermal interface material coupled to the first portion of the cooling component. Similarly, the second portion of the cooling component is thermally coupled with the one or more electronic components via one or more second thermal interface materials coupled to the second portion of the cooling component. The method 1100 ends at block 1110.

Compared to existing method of imbedding the power conversion components, the usage of an auxiliary module of the present disclosure may provide the benefits such as a) cooling component being the passive heat sink does not add a leak risk but provides high thermal performance results with cooling conduit contact, b) auxiliary module with poor reliability (relatively) parts can be swapped and not discard the extremely expensive processor PCA or the main PCA, c) replaceable auxiliary module will reduce service time/cost and prevent accidental damage of other internal components of the electronic device, d) self-align capability of the cooling component on the cooling conduit may allow for the thin gap pads to be disposed therebetween the cooling component and the cooling conduit which saves money and results in the best thermal performance, and e) not integrating the power on the processor PCA or the main PCA may prevent issues with critical signal routing and integrity performance.

In the foregoing description, numerous details are set forth to provide an understanding of the subject matter disclosed herein. However, implementation may be practiced without some or all of these details. Other implementations may include modifications, combinations, and variations from the details discussed above. It is intended that the following claims cover such modifications and variations.

What is claimed is:

1. An auxiliary module for supporting a printed circuit assembly (PCA) comprising a processing resource of an electronic device, comprising:
   an auxiliary PCA comprising:
   a circuit board;
   an electrical connector coupled to the circuit board; and
   one or more electronic components coupled to the circuit board,
   a plurality of attachment elements configured to attach the auxiliary module to a plurality of supporting arms protruding from the PCA such that the electrical connector is electrically connected with a complementary electrical connector of the PCA, and the plurality of attachment elements extend through apertures in the plurality of supporting arms; and
   a cooling component configured to be attached to the auxiliary PCA and comprising:
   a first portion configured to be thermally coupled to a cooling conduit of the electronic device in an installed state of the auxiliary module in the electronic device; and
   a second portion configured to be thermally coupled to the one or more electronic components in an attached state of the cooling component to the auxiliary PCA,
   wherein, in an attached state of the auxiliary module to the plurality of supporting arms and a coupled state of the electrical connector with the complementary electrical connector, the auxiliary module is movable along one or more directions relative to the plurality of supporting arms.

2. The auxiliary module of claim 1, wherein the first portion of the cooling component comprises an engagement feature configured to interface with a complementary engagement feature of the cooling conduit, and a biasing element configured to push the engagement feature onto the complementary engagement feature to thermally couple the cooling component to the cooling conduit.

3. The auxiliary module of claim 2, wherein the biasing element is one of a captive fastener assembly, a snap-fit assembly, or a spring assembly.

4. The auxiliary module of claim 1,
   wherein the plurality of attachment elements comprises a plurality of standoffs,
   wherein the apertures of the plurality of supporting arms comprise a plurality of slots and, when the auxiliary module is attached to the supporting arms, each standoff of the plurality of standoffs extends through a corresponding slot of the plurality of slots, where a width of each slot of the plurality of slots is greater than a diameter of each standoff of the plurality of standoffs to allow the auxiliary module to move relative to the plurality of supporting arms.

5. The auxiliary module of claim 4, further comprising:
   a plurality of fasteners,
   wherein the second portion of the cooling component further includes a plurality of openings, and
   wherein, in the attached state of the auxiliary module to the plurality of supporting arms and the attached state of the cooling component to the auxiliary PCA, the supporting arms are located between the auxiliary PCA and the cooling component, each opening of the plurality of openings is aligned to a corresponding standoff of the plurality of standoffs, and the cooling component is attached to the auxiliary PCA and to the plurality of supporting arms via the plurality of fasteners extending through the plurality of openings and into the plurality of standoffs.

6. The auxiliary module of claim 5,
   wherein each supporting arm of the plurality of supporting arms further comprises a notch; and
   wherein the second portion of the cooling component further comprises protrusions, where each protrusion is configured to extend via the notch and contact the circuit board to limit over constraining of each of the plurality of fasteners while coupling the cooling component and the auxiliary PCA to each other.

7. The auxiliary module of claim 5, wherein the plurality of openings comprises a first opening, a second opening, and a pair of third openings, where the first and second openings are formed on a diagonally opposite sides of the second portion of the cooling component and the pair of third openings are formed on another diagonally opposite sides of the second portion of the cooling component, and wherein the second opening is an elongated slot having long edges that extends parallel to an axis extending between centers of the first opening and the second opening.

8. The auxiliary module of claim 1, further comprising a first thermal interface material coupled to the first portion of the cooling component and one or more second thermal interface materials coupled to the second portion of the cooling component, wherein the first portion of the cooling component is configured to thermally couple with the cooling conduit via the first thermal interface material, and wherein the second portion of the cooling component is configured to thermally couple with the one or more electronic components via the one or more second thermal interface materials.

9. An electronic device, comprising:
a support structure having a base and a plurality of supporting arms protruding from the base;
a printed circuit assembly (PCA) comprising:
a processor circuit board disposed on the base; and
a complementary electrical connector coupled to the processor circuit board; and
an auxiliary module for supporting the PCA, comprising:
an auxiliary PCA comprising:
a circuit board mounted to the plurality of supporting arms;
an electrical connector coupled to the circuit board; and
one or more electronic components coupled to the circuit board,
a plurality of attachment elements attaching the auxiliary module to the plurality of supporting arms protruding from the PCA such that the electrical connector is electrically connected with the complementary electrical connector, and the plurality of attachment elements extend through apertures in the plurality of supporting arms; and
a cooling component attached to the auxiliary PCA and comprising:
a first portion thermally coupled to a cooling conduit of the electronic device in an installed state of the auxiliary module in the electronic device; and
a second portion thermally coupled to the one or more electronic components in an attached state of the cooling component to the auxiliary PCA,
wherein, in an attached state of the auxiliary module to the plurality of supporting arms and a coupled state of the electrical connector with the complementary electrical connector, the auxiliary module is movable along one or more directions relative to the plurality of supporting arms.

10. The electronic device of claim 9, wherein the first portion of the cooling component comprises an engagement feature configured to interface with a complementary engagement feature of the cooling conduit, and a biasing element configured to push the engagement feature onto the complementary engagement feature to thermally couple the cooling component to the cooling conduit.

11. The electronic device of claim 10, wherein the biasing element is one of a captive fastener assembly, a snap-fit assembly, or a spring assembly.

12. The electronic device of claim 10,
wherein the plurality of attachment elements comprises a plurality of standoffs,
wherein the apertures of the plurality of supporting arms comprise a plurality of slots and, when the auxiliary module is attached to the supporting arms, each standoff of the plurality of standoffs extends through a corresponding slot of the plurality of slots, where a width of each slot of the plurality of slots is greater than a diameter of each standoff of the plurality of standoffs to allow the auxiliary module to move relative to the plurality of supporting arms.

13. The electronic device of claim 12, further comprising:
a plurality of fasteners,
wherein the second portion of the cooling component further includes a plurality of openings, and
wherein, in the attached state of the auxiliary module to the plurality of supporting arms and the attached state of the cooling component to the auxiliary PCA, the supporting arms are located between the auxiliary PCA and the cooling component, each opening of the plurality of openings is aligned to a corresponding standoff of the plurality of standoffs, and the cooling component is attached to the auxiliary PCA and to the plurality of supporting arms via the plurality of fasteners extending through the plurality of openings and into the plurality of standoffs.

14. The electronic device of claim 13,
wherein each supporting arm of the plurality of supporting arms further comprises a notch; and
wherein the second portion of the cooling component further comprises protrusions, where each protrusion is configured to extend via the notch and contact the circuit board to limit over constraining of each of the plurality of fasteners while coupling the cooling component and the auxiliary PCA to each other.

15. The electronic device of claim 13, wherein the plurality of openings comprises a first opening, a second opening, and a pair of third openings, where the first and second openings are formed on a diagonally opposite sides of the second portion of the cooling component and the pair of third openings are formed on another diagonally opposite sides of the second portion of the cooling component, and wherein the second opening is an elongated slot having long edges that extends parallel to an axis extending between centers of the first opening and the second opening.

16. The electronic device of claim 9, further comprising a first thermal interface material coupled to the first portion of the cooling component and one or more second thermal interface materials coupled to the second portion of the cooling component, wherein the first portion of the cooling component is configured to thermally couple with the cooling conduit via the first thermal interface material, and wherein the second portion of the cooling component is configured to thermally couple with the one or more electronic components via the one or more second thermal interface materials.

17. The electronic device of claim 9, further comprising a main PCA configured to support the PCA and the auxiliary PCA via the PCA, wherein the primary PCA is comprises a main circuit board having a secondary electrical connector, and wherein the PCA comprises a tertiary electrical connector electrically connected to the secondary electrical connector.

18. A method comprising:
mounting a circuit board of an auxiliary module to a plurality of supporting arms protruding from a support structure of a printed circuit assembly (PCA) of an electronic device such that an electrical connector coupled to the circuit board is electrical connected with a complementary electrical connector coupled to the PCA, and a plurality of attachment elements of the auxiliary module extends through apertures in the plurality of supporting arms;

positioning a cooling component of the auxiliary module on an auxiliary PCA of the auxiliary module and a cooling conduit of the electronic device such that a first portion of the cooling component is disposed on the cooling conduit and a second portion of the cooling component is disposed on one or more electronic components coupled to the circuit board; and attaching the cooling component to a plurality of attachment elements of the auxiliary module such that the auxiliary module is movable along one or more directions relative to the plurality of supporting arms to align the first portion of the cooling component on the cooling conduit and thermally couple the first portion to the cooling conduit and the second portion to the one or more electronic components.

19. The method of claim 18, wherein attaching the cooling component to the plurality of attachment elements of the auxiliary module comprises:

extending a first fastener along a first opening formed on the cooling component and a first attachment element coupled to the circuit board to shift the auxiliary module along at least one of a longitudinal direction or a lateral direction to align the first portion of the cooling component on the cooling conduit;

extending a second fastener along a second opening formed on the cooling component and a second attachment element coupled to the circuit board to rotate the auxiliary module along a radial direction for mounting the first portion of the cooling component on the cooling conduit; and extending a pair of third fasteners along a pair of third openings formed on the cooling component and a pair of third attachment elements coupled to the circuit board to push the auxiliary module along the radial direction for thermally coupling the first portion with the cooling conduit and the second portion with the one or more electronic components of the circuit board.

20. The method of claim 18, wherein thermally coupling the cooling component to the cooling conduit and the circuit board comprises:

thermally coupling the first portion of the cooling component with the cooling conduit via a first thermal interface material coupled to the first portion of the cooling component; and thermally coupling the second portion of the cooling component with the one or more electronic components via one or more second thermal interface materials coupled to the second portion of the cooling component.

* * * * *